United States Patent [19]

Harada

[11] Patent Number: 5,126,825
[45] Date of Patent: Jun. 30, 1992

[54] WIRING STRUCTURE OF A SEMICONDUCTOR DEVICE WITH BETA TUNGSTEN

[75] Inventor: Yusuke Harada, Tokyo, Japan

[73] Assignee: Oki Electric Industry Co., Ltd., Tokyo, Japan

[21] Appl. No.: 555,595

[22] Filed: Jul. 23, 1990

[30] Foreign Application Priority Data

Jul. 26, 1989 [JP] Japan .................................. 1-191304

[51] Int. Cl.$^5$ ........................................... H01L 23/532
[52] U.S. Cl. ........................................ 357/71; 357/65; 357/67
[58] Field of Search ............................... 357/71, 67, 65

[56] References Cited

U.S. PATENT DOCUMENTS 4,902,645 2/1990 Ohba .................................... 437/200

OTHER PUBLICATIONS

Takayuki Ohba, et al., "Selective CVD Tungsten Silicide For VLSI Applications", Int'l Electron Devices Meeting, Dec. 6-9, 1987, pp. 213-216.

*Primary Examiner*—William D. Larkins
*Attorney, Agent, or Firm*—Spencer, Frank & Schneider

[57] ABSTRACT

A wiring structure of a semiconductor device comprises a silicon substrate, a diffusion layer formed in the silicon substrate, an insulating layer formed on the silicon substrate, the insulating layer having a contact hole which exposes the diffusion layer, a beta tungsten layer selectively formed in the contact hole so that the contact hole is filled with beta tungsten, and a wiring layer formed on the insulating layer and the beta tungsten layer, the beta tungsten extending through the contact hole so as to electrically connect the wiring layer and the diffusion layer.

9 Claims, 5 Drawing Sheets

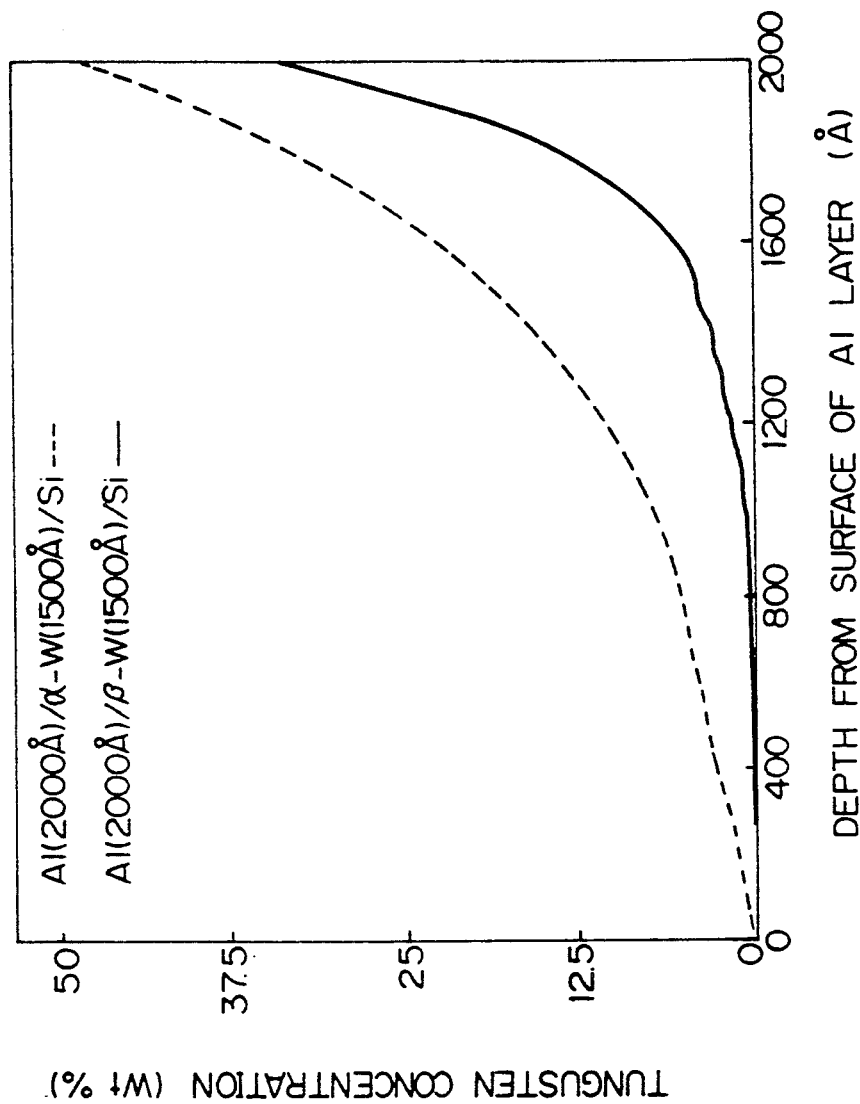

WIRING STRUCTURE OF A SEMICONDUCTOR DEVICE WITH BETA TUNGSTEN

BACKGROUND OF THE INVENTION

The invention relates to a semiconductor device and more particularly, to a wiring structure which connects conductive layers with tungsten.

A typical known wiring structure of a semiconductor device in which two conductive layers are electrically connected by alpha tungsten (hereafter "α-W") extending through a contact hole in an insulating layer between the conductive layers is illustrated in FIG. 1. Referring to FIG. 1, such a wiring structure can be formed as follows: A field oxide layer 12 is formed on a field region of a silicon substrate 11 by a selective oxidation, i.e., the well known local oxidation of silicon method (hereafter "LOCOS method"). Then a diffusion region 13 is formed in an active region of the substrate 11. An insulating layer 14, such as layer of boron phosphorus silicate glass (hereafter "BPSG"), is deposited over the entire surface of the substrate 11 by the chemical vapor deposition (hereafter "CVD") method. The insulating layer 14 is subjected to a heat treatment ot flatten the surface thereof. Subsequently, the insulating layer 14 is selectively removed by photolithographic etching to form a contact hole 15. An α-W layer 16 is selectively deposited only in the contact hole 15 by a selective CVD method. The method includes application to the hole of a gaseous mixture of $SiH_4$ and $WF_6$ in a ratio $SiH_4/WF_6 < 1.0$ at a gas pressure of 0.01–0.3 Torr and temperature of 230°–400 ° C. A wiring layer 17 formed of Al-Si alloy is deposited on the insulating layer 14 and the α-W layer 16 by a sputtering method. The α-W layer 16 provides an electrical connection between the diffusion layer 13 (one conductive layer) and the Al-Si alloy layer 17 (another conductive layer). An electrical connection provided by the above method prevents disconnection between conductive layers and provides a highly reliable wiring structure.

However, during a further heat treatment performed after the formation of the Al-Si alloy layer, the α-W 16 reacts with Al-Si alloy and the α-W is diffused into the Al-Si alloy layer 17 to form an α-W diffused Al-Si alloy region 18 in the Al-Si alloy layer 17, as shown in FIG. 2. The higher the temperature at which the heat treatment is performed, the more α-W reacts with the Al-Si alloy. Since the resistance of the α-W diffused Al-Si alloy region 18 is higher than that of the Al-Si alloy layer 17, the resistance of the wiring layer increases in because of the heat treatment.

SUMMARY OF THE INVENTION

It is an object of the present invention to provide a wiring structure having a low resistance wiring layer. It is another object of the present invention to provide a wiring structure having a high reliability. It is still another object of the present invention to provide a wiring structure which prevents electrical disconnection of the conductive layers.

Experiments have shown that using beta tungsten instead of alpha tungsten to connect the diffusion layer and wiring layer provides a wiring structure which has a high reliability, prevents electrical disconnection of the conductive layers and substantially reduces the amount of diffusion of the tungsten into the wiring layer so that resistance of the wiring layer remains low.

A wiring structure for a semiconductor device according to the invention therefore comprises a conductive lower layer, for example, a diffusion layer formed in a silicon substrate, an insulating layer formed on the lower conductive lower layer, the insulating layer having a contact hole exposing lower conductive layer, a beta tungsten layer formed only in the contact hole such that the contact hole is filled with beta tungsten, and an conductive upper layer or wiring layer formed on the insulating layer and the beta tungsten layer, the beta tungsten layer electrically connecting the wiring layer to and the conductive lower layer.

BRIEF DESCRIPTION OF THE DRAWINGS

These and other features and advantages of the invention will be further understood from the following detailed description of the preferred embodiments with reference to the accompanying drawings in which:

FIG. 5 is a graph showing alpha tungsten and beta tungsten concentrations diffused into the Al layer after a heating treatment.

DESCRIPTION OF THE PREFERRED EMBODIMENT

Figure 1:
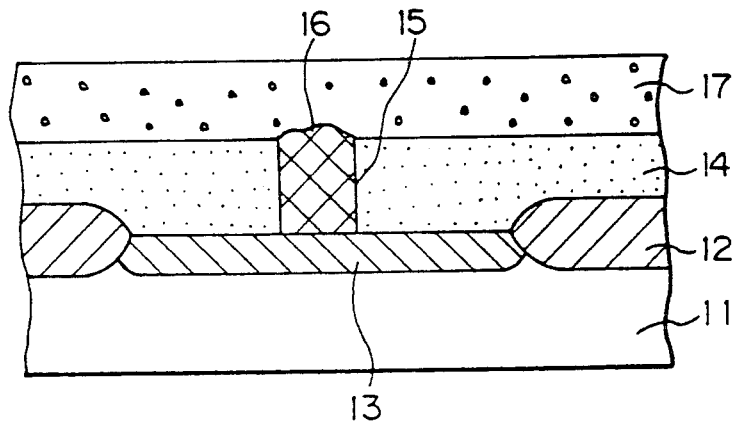
FIG. 1 is a sectional view of a prior art wiring structure of a semiconductor device.
Figure 2:
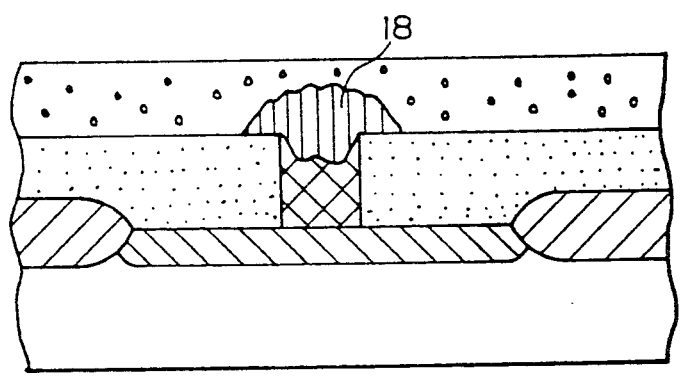
FIG. 2 is a sectional view of a prior art wiring structure of a semiconductor device subjected to a heating treatment after the formation of the Al-Si alloy layer.
Figure 3:
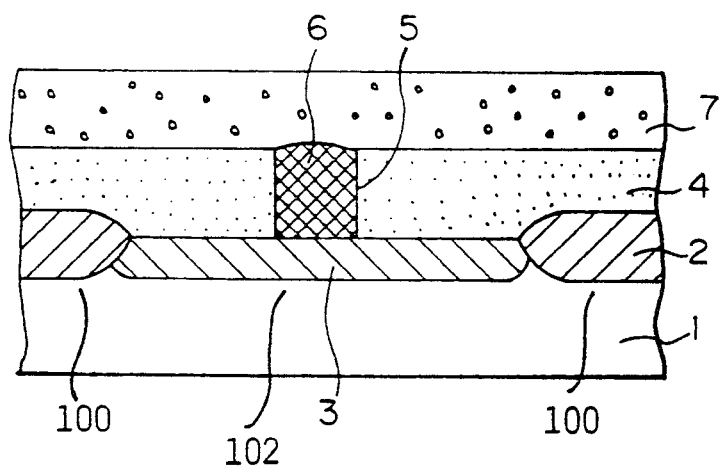
FIG. 3 is a sectional view of a wiring structure of a semiconductor device according to the preferred embodiment of the present invention.

FIG. 3 shows an embodiment of a wiring structure of the present invention. A field oxide layer 2 is formed on a field region 100 of a silicon substrate 1. A diffusion layer 3 to serve as a lower conductive layer is formed in an active region 102 of the silicon substrate 1. An insulating layer 4 is formed on the field oxide layer 2 and the active region of the silicon substrate 1. A contact hole 5 is formed on the diffusion layer 3. A layer or film 6 of Beta tungsten (hereafter "β-W") is deposited in the contact hole 5. The β-W layer 6 is selectively deposited only in the contact hole 5 by the selective CVD method. The method includes application to the hole of a gaseous mixture of $SiH_4$ and $WF_6$ in a ratio $1.0 < SiH_4/WF_6 < 1.2$ at a gas pressure of 0.01–0.3 Torr and a temperature of 270–400(° C). A conductive layer 7 serving as on upper conductive layer, for example an Al layer, is deposited on the insulating layer 4 and the β-W layer 6. The β-W film serves as an electrical connection between the diffusion layer 2 and the conductive layer 7.

Some differences in the properties and manner of forming α-W and β-W are explained with reference to the following table.

TABLE

|  | α-W | β-W |
| --- | --- | --- |
| Forming temperature | 230–400(°C.) | 270–400(°C.) |
| Forming gas ratio | $SiH_4/WF_6 < 1.0$ | $1.2 > SiH_4/WF_6 \geq 1.0$ |
| Forming gas pressure | 0.01–0.3(Torr) | 0.01–0.3(Torr) |

TABLE-continued

|  | α-W | β-W |
| --- | --- | --- |
| Crystal structure reaction with Al or Al—Si alloy | Body-centered cubic substantial | A15 structure minimum |

Figure 4:
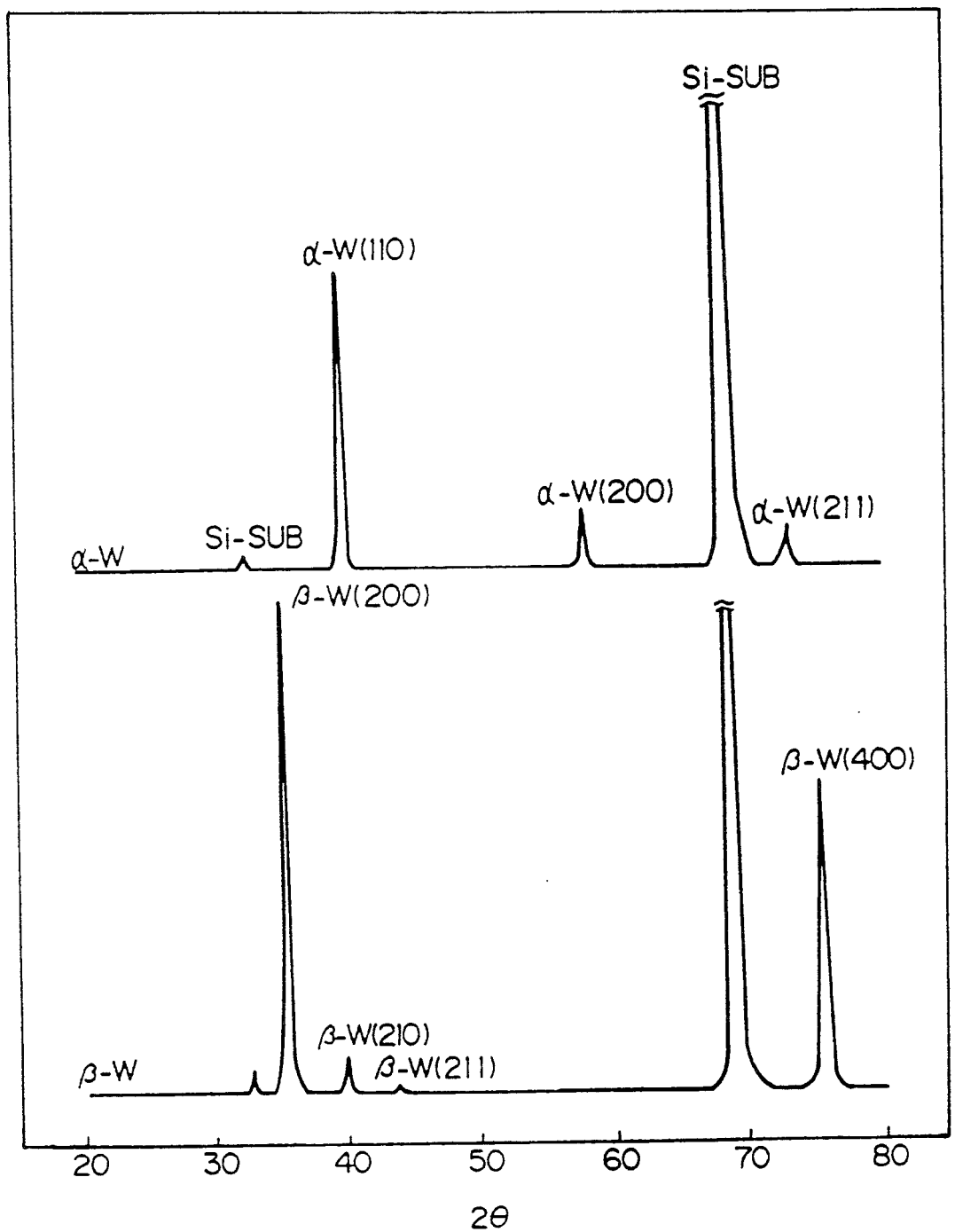
FIG. 4 is a graph showing X-ray diffraction patterns of alpha tungsten and beta tungsten.

An important difference between α-W and β-W is in their respective crystal structures. The difference of crystal structure between α-W and β-W is recognized from their x-ray diffraction patterns. FIG. 4 shows the respective x-ray diffraction patterns of α-W and β-W. An X-ray diffraction pattern of α-W on a silicon substrate has its highest peak at "α-W(110)". On the other hand, the X-ray diffraction pattern of β-W on a silicon substrate has its highest peak at "β-W(200)". It is considered by the inventor that Al-Si alloy or Al reacts less with β-W than with α-W because of the crystal structures thereof.

In order to evaluate the difference in diffusion of β-W and α-W into the wiring layer, the following experiment was performed.

An α-W layer with a thickness of 1500Å was deposited on a silicon substrate, and an Al layer having a thickness of 2000Å was deposited on the α-W layer. A β-W layer having a thickness of 1500Å was deposited on a silicon substrate, and an Al layer having a thickness of 2000Å was deposited on the β-W layer. The two materials were subjected to a heat treatment in a nitrogen atmosphere at a temperature of 500° C. for 30 minutes. FIG. 5 shows the concentrations of alpha tungsten and beta tungsten in the Al layers of the materials subjected to the heat treatment. The tungsten concentration by weight was measured by Rutherford backscattering spectrometry. There is a higher concentration of tungsten in the Al layer formed on the α-W layer (the dotted line graph in FIG. 5) than in the Al layer formed on the β-W layer (the solid line graph in FIG. 5). Thus, the Al layer deposited on the β-W layer has a lower resistance than the Al layer deposited on the α-W layer.

Figure 6A:
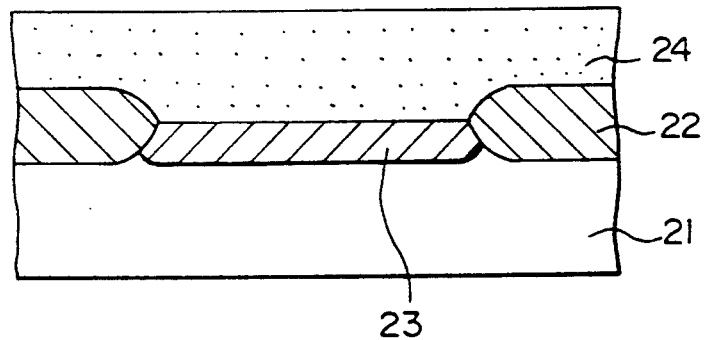
FIGS. 6A to 6C are sectional views showing various steps in the method of manufacturing a wiring structure of a semiconductor device according to the preferred embodiment of the present invention.

A method of manufacturing a wiring structure of the present invention will be described with reference to FIG. 6A to FIG. 6C. As is illustrated in FIG. 6A, a field oxide layer 22, such as a silicon oxide layer, is formed on a silicon substrate 21 by the LOCOS method. A diffusion layer 23 is formed in the substrate 21. Then, an insulating layer 24, such as a BPSG layer, is formed on the field oxide layer 22 and the substrate 21 by the CVD method. The insulating layer 24 is subjected to the heat treatment in a nitrogen gas atmosphere at a temperature of 950° C. for 30 minutes to flatten the surface thereof.

Figure 6B:
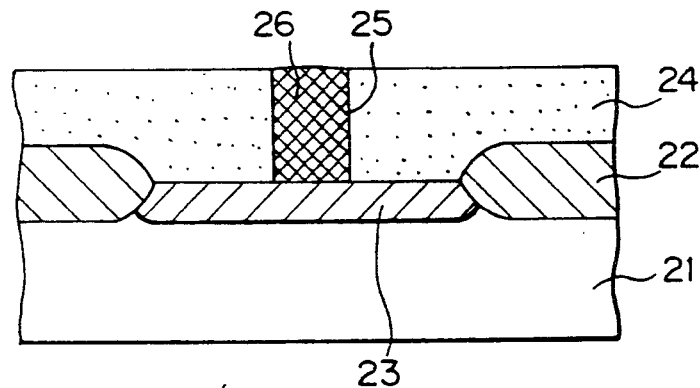

Next, as is illustrated in FIG. 6B, a part of the insulating layer 24 is subjected to photolithographic etching to form a contact hole 25 which exposes the diffusion layer 23. Then, the contact hole 25 is filled with β-W by the selective CVD method so as to form a β-W layer 26 in contact with the diffusion layer 23. That is, the β-W layer 26 is deposited only on the diffusion layer 23. The selective CVD method is performed with forming gases $SiH_4$ and $WF_6$ at a temperature in the range 270°–400° C., the forming gases being present in the ratio $1.2 > SiH_4/WF_6 \geq 1.0$ at gas pressure of 0.01–0.3 Torr. In the formation of the β-W layer 26, a most importance condition is that the forming gas ratio $SiH_4/WF_6$ is in the range $1.2 > SiH_4/WF_6 \geq 1.0$ since if the radio is less than 1.0 then α-W will be formed.

Figure 6C:
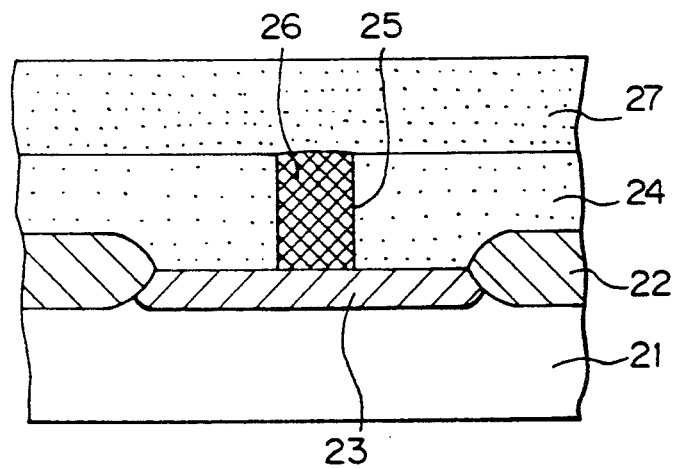

Subsequently, as is illustrated in FIG. 6C, an Al-Si alloy layer as a wiring layer 27 having a thickness of about 7000Å is deposited on the insulating layer 24 and the β-W layer 26. Although a layer of Al-Si alloy is used as a wiring layer other compositions which include Al, such as a layer of substantially pure Al, can also be used. Moreover, in the invention described, the β-W layer 26 is selectively deposited on the diffusion layer 23 formed in the silicon substrate 21. The diffusion layer is a conductive layer which includes silicon and may, for example be a silicide layer.

The invention is not limited to the embodiments described above, and various modifications can be made without departing the scope and the spirit of the invention which are defined by the appended claims.

What is claimed is:

1. A wiring structure for a semiconductor device, comprising:
    a silicon substrate;
    a diffusion layer formed in the silicon substrate;
    an insulating layer formed on the silicon substrate, the insulating layer having a contact hole exposing the diffusion layer;
    an electrically conductive layer filling said contact hole, said electrically conductive layer including tungsten, all tungsten in said electrically conductive layer consisting essentially of beta tungsten; and
    a wiring layer formed on the insulating layer, said electrically conductive layer, including said beta tungsten extending through said contact hole so as to electrically connect said diffusion layer to said wiring layer.

2. A wiring structure according to claim 1, wherein said silicon substrate has a field region and an active region.

3. A wiring structure according to claim 2, wherein said silicon substrate has an field oxide layer in the field region.

4. A wiring structure according to claim 2, wherein said diffusion layer is located in the active region.

5. A wiring structure according to claim 1, wherein said wiring layer includes aluminum.

6. A wiring structure according to claim 1, wherein said wiring layer is a layer of Al-Si alloy.

7. A wiring structure for a semiconductor device, comprising:
    a lower conductive layer including silicon;
    an insulating layer formed on the lower conductive layer, the insulating layer having a contact hole exposing the lower conductive layer;
    an electrically conductive layer formed in said contact hole, said electrically conductive layer includes tungsten, all tungsten in said electrically conductive layer consisting essentially of beta tungsten; and
    an upper conductive layer formed on the insulating layer, said electrically conductive layer, including said beta tungsten, extending through said contact hole so as to electrically connect the lower conductive layer and the upper conductive layer, said upper conductive layer including aluminum.

8. A wiring structure according to claim 7, where said lower conductive layer is a diffusion layer formed in a silicon substrate.

9. A wiring structure according to claim 8, wherein said upper conductive layer is a layer of Al-Si.

* * * * *